(12) United States Patent
Hao et al.

(10) Patent No.: US 10,469,081 B2
(45) Date of Patent: Nov. 5, 2019

(54) SPLIT TYPE DUAL OPTICAL PATH KEY SWITCH AND A MECHANICAL KEYBOARD

(71) Applicants: Xiaoni Hao, Guangzhou (CN); Yile Zhang, Wenzhou (CN); Yuangong Sa, Zhuhai (CN)

(72) Inventors: Xiaoni Hao, Guangzhou (CN); Yile Zhang, Wenzhou (CN); Yuangong Sa, Zhuhai (CN)

( * ) Notice: Subject to any disclaimer, the term of this patent is extended or adjusted under 35 U.S.C. 154(b) by 0 days.

(21) Appl. No.: 16/087,070

(22) PCT Filed: Nov. 4, 2016

(86) PCT No.: PCT/CN2016/104497
§ 371 (c)(1),
(2) Date: Sep. 20, 2018

(87) PCT Pub. No.: WO2017/161891
PCT Pub. Date: Sep. 28, 2017

(65) Prior Publication Data
US 2019/0238132 A1  Aug. 1, 2019

(30) Foreign Application Priority Data
Mar. 21, 2016 (CN) .......................... 2016 1 0162536

(51) Int. Cl.
*H03K 17/96* (2006.01)
(52) U.S. Cl.
CPC .......... *H03K 17/9629* (2013.01); *H03K 17/96* (2013.01); *H03K 17/9631* (2013.01); *H03K 17/9638* (2013.01)
(58) Field of Classification Search
CPC ........... H03K 17/9629; H03K 17/9638; H03K 17/9631; H03K 17/96
(Continued)

(56) References Cited

U.S. PATENT DOCUMENTS

| 4,803,362 A | * | 2/1989 | Butts | ...................... | H01H 13/50 |
| | | | | | 250/229 |
| 2014/0151205 A1 | | 6/2014 | Chou | | |
| 2017/0115747 A1 | * | 4/2017 | Chen | .................... | H03K 17/969 |

FOREIGN PATENT DOCUMENTS

| CN | 101247120 A | 8/2008 |
| CN | 104966636 A | 10/2015 |

(Continued)

OTHER PUBLICATIONS

ISA/CN, International Search Report dated Jan. 5, 2017 for International Patent Application No. PCT/CN2016/104497, 4 pages.

*Primary Examiner* — Seung C Sohn
(74) *Attorney, Agent, or Firm* — Masuvalley & Partners

(57) ABSTRACT

The invention discloses a split type dual optical path key switch and a mechanical keyboard. The key switch comprises a key switch body, an LED emitter and a light receiver disposed on the PCB, wherein the key switch body comprises a housing and a handle disposed on the housing. The LED emitter and the light receiver are separated by a first light blocking component; a first light guiding body is disposed above the LED emitter, and a second light guiding body is disposed above the light receiver. The first guiding body is provided with a light transmitting portion and a first light reflecting portion, the second light guiding body is provided with a second light reflecting portion, and the handle is provided with a second light blocking component. The key switch can not only realize the function of backlight through the LED emitter, but also connect the switch with the help of the light receiver, so that the entire housing can reserve a sufficient space. In addition, transmitting light through the two light guiding bodies improves the stability of transmission, reduces the cost and process requirements of the key switch, and greatly improves the precision and service life of the mechanical keyboard.

10 Claims, 6 Drawing Sheets

(58) Field of Classification Search
USPC .............................................. 250/559.4, 224
See application file for complete search history.

(56) References Cited

FOREIGN PATENT DOCUMENTS

| CN | 105245217 A | 1/2016 |
| CN | 105577157 A | 5/2016 |
| CN | 205545195 U | 8/2016 |

* cited by examiner

SPLIT TYPE DUAL OPTICAL PATH KEY SWITCH AND A MECHANICAL KEYBOARD

TECHNICAL FIELD

The invention relates to a key switch and a mechanical keyboard, in particular to a split type dual optical path key switch and a mechanical keyboard, belonging to the field of mechanical keyboard.

BACKGROUND OF THE INVENTION

Mechanical keyboard is a common kind of keyboard with a separate switch for each key to control its on/off. Mechanical keyboard has always been a representative of high-end products, and it is welcomed by more and more computer users and gamers. Normally the switch used is a metal-contact mechanical key switch. The switch is installed in the housing, which controls the on/off of the switch through contact between the metal contact of the static pressure plate and the dynamic pressure plate. During the displacement of the handle of the mechanical switch, the metal contact of the dynamic pressure plate and that of the static pressure plate contact with each other so that the mechanical switch is on. When the handle of the mechanical switch is released, the dynamic pressure plate returns to the original position under the elastic force of the spring, and the metal contact of the dynamic pressure plate separates with the metal contact of the static pressure plate so that the mechanical switch is off. With this kind of scheme, the metal contact of the mechanical switch is easily damaged because in the process of pressing the key, the elasticity of the dynamic pressure plate becomes greatly different from the original state with increasing number of use, resulting in insensitive contact or unavailable connection of the metal contact, limited service life and causing trouble to the user. In addition, the traditional optical axis mechanical keyboard arranges the crystal light transmitting component and light receiver in the key switch with the bottom pin soldered on PCB and the key switch engaged in the slot; finally the PCB and the iron plate are fixed by a fixing column on the rotatable iron plate. Once a key is damaged, it is troublesome to disassemble and repair it. It is necessary to not only unscrew the fixing column, but also pull the crystal light receiver and light transmitting component from the PCB. Under the circumstance, it is difficult to handle and is easy to cause damage to the keyboard. Moreover, this kind of keyboard is also disadvantageous for large-scale industrial production.

SUMMARY OF THE INVENTION

The object of the present invention is to solve the above drawbacks of the prior art, and provide a split type dual optical path key switch, which has the advantages of simple structure, convenient use, good light guiding performance, simple production process, long service life, etc. By LED emitter, it can not only realize the function of backlight, but also connect the switch with the help of the light receiver, so that a sufficient space can be reserved in the entire housing to dispose other components; wherein the split type refers to the arrangement that the mechanical key portion has no conductive component, while all conductive components are placed on the PCB so that only when they are assembled in a specific manner can a photoelectric switch function be achieved; the dual optical path means that the LED emitter can provide two light paths after passing through the light guiding body, one of which can provide backlight for the light transmitting keycap, and another one of which can connect the light receiver after transmission.

Another object of the present invention is to provide a split type dual optical path mechanical keyboard.

The object of the present invention can be achieved by adopting the following technical solutions:

A split type dual optical path key switch, comprising a key switch body that comprises a housing and a handle disposed on the housing, wherein the split type dual optical path key switch further comprises an LED emitter and a light receiver disposed on a PCB, wherein the LED emitter and the light receiver are separated by a first light blocking component; a first light guiding body is disposed above the LED emitter, and a second light guiding body is disposed above the light receiver; the first light guiding body is provided with a light transmitting portion and a first light reflecting portion, and the second light guiding body is provided with a second light reflecting portion; the light transmitting portion is used for transmitting the light emitted by the LED emitter; the light emitted by the LED emitter is reflected by the first light reflecting portion to the second light reflecting portion, and then reflected by the second light reflecting portion to the light receiver; the handle is provided with a second light blocking component; the second light blocking component is used for blocking light transmitted from the first light guiding body to the second light guiding body.

Preferably, the housing is provided with a hand-feeling elastic piece, and the handle is further provided with a slider, the left and right front side of which is partially convex to contact with the hand-feeling elastic piece; when the handle is pressed, the slider is driven to move downward, and the shape of the hand-feeling elastic piece is changed by the pressure to provide a sense of stepwise pressing; when the handle moves upward from the bottom, since the handle is separated from the slider, they hit with each other and make a sound.

Preferably, the first light guiding body and the second light guiding body are all in a separated form and are assembled in the housing, or the light guiding body, the second light guiding body and the housing are prepared by two-color injection molding.

Preferably, the key switch is in a closed form normally, and when the handle is not pressed, the second light blocking component blocks the light transmission path from the first light guiding body to the second light guiding body; when the handle is pressed, the second light blocking component is driven to move downward, so that the light transmission path from the first light guiding body to the second light guiding body is clear.

Preferably, the key switch is in an open form normally, and when the handle is not pressed, the second light blocking component makes the light transmission path from the first light guiding body to the second light guiding body clear; when the handle is pressed, the second light blocking component is driven to move downward to block the light transmission path from the first light guiding body to the second light guiding body.

Preferably, the housing comprises an upper housing and a lower housing, and the upper housing has a hole where the handle is disposed; a hand-feeling elastic piece is disposed in the lower housing, and the lower housing is further provided with an elastic component, and the handle is disposed above the elastic component.

Preferably, the first light blocking component is a light blocking plate or a combination of a light blocking plate and a sealing ring; the light blocking plate is disposed at the bottom of the key switch body, the PCB board is provided with a slot corresponding to the light blocking plate, which is disposed in the slot.

Preferably, the LED emitter is a monochromatic LED light, a dichromatic LED light or an RGB trichromatic LED light.

Preferably, the first light reflecting portion is disposed obliquely to the left side, and the second light reflecting portion is disposed obliquely to the right side.

Another object of the invention can be achieved by the following technical scheme:

A split type dual optical path mechanical keyboard, comprising a PCB, wherein it further comprises a plurality of the above mentioned key switches, wherein a fixing plate is disposed between the PCB and the key switch, and the key switch is mounted on the PCB by the fixing plate; the PCB and the fixing plate are fixed by screws or clamping.

Preferably, the outer surface of the PCB has a protective film formed by a transparent waterproof paint.

The present invention has the following benefits compared with the prior art:

1. The key switch and the mechanical keyboard of the present invention are provided with an LED emitter and a light receiver on a PCB, while a first light guiding body is disposed above the LED emitter, and a second light guiding body is disposed above the light receiver. The two light guide bodies are made of a material with good light guiding properties such as light guiding fiber and light guiding plastic. In addition, the first light guiding body is provided with a light transmitting portion and a first light reflecting portion, and the second light guiding body is provided with a second light reflecting portion. The light transmitting portion can transmit the light emitted by the LED emitter, that is, the LED emitter can serve as an indicator light to illuminate and provide backlight for the light transmitting keycap. And through the first light reflecting portion and the second light reflecting portion, the light emitted by the LED emitter can be reflected to the light receiver. Since the LED emitter realizes the function of backlight, it is not necessary to separately provide an LED for backlight and a light guiding plate for transmitting the LED backlight, so that the a large space can be reserved in the housing to dispose other components. Moreover, the transmission of the first light guiding body and the second light guiding body improves the stability of light transmission, reduces the cost and process requirements of the key switch, and greatly improves the accuracy and service life of the mechanical keyboard.

2. In the key switch and the mechanical keyboard of the present invention, the first light guiding body, the second light guiding body and the housing can be produced by two-color injection molding, by which the components are formed in one piece so that the assembly cost is greatly reduced and the performance is improved.

3. In the key switch and the mechanical keyboard of the present invention, the keyboard switch body is separately disposed from the LED emitter and the light receiver, that is, the mechanical and electronic components are completely separated, which is beneficial to the disassembly of the PCB and the fixing plate, and is convenient for maintenance and repairment.

4. In the key switch and the mechanical keyboard of the present invention, the LED emitter and the light receiver are separated by a first light blocking component, which may be a light blocking plate or a combination of a light blocking plate and a sealing ring. The PCB is provided with a slot corresponding to the light blocking plate, and the light blocking plate is disposed in the slot to completely block the light of the LED emitter and the external light from entering the light receiver.

5. The key switch and the mechanical keyboard of the present invention are provided with a hand-feeling elastic piece in a space reserved in the housing, and a slider is arranged on the handle. When the handle is pressed, the slider is driven to move downward, and the shape of the hand-feeling elastic piece is affected by the pressure to provide a sense of stepwise pressing; when the handle is moved upward from the bottom, the handle is separated from the slider to generate an impact, thereby emitting a sound. Therefore, the arrangement can not only provide a sense of stepwise pressing, but also emit a sound, which further improves the user experience.

6. In the key switch and the mechanical keyboard of the present invention, the LED emitter and the light receiver can be produced in a large-scale by machine, thereby overcoming the disadvantage of traditional process that requires manual operation, which greatly reduces the production cost.

7. In the key switch and the mechanical keyboard of the present invention, the LED emitter and the light receiver are disposed on the PCB in the form of a patch, which is convenient for installation and maintenance.

8. The on-off precision of the key switch of the present invention is only related to the relative positions of the second light blocking component and the light paths of the first light guiding body and the second light guiding body, and complete control without being affected by the relative positions of the PCB and the fixing plate can be achieved.

9. The outer surface of the PCB in the mechanical keyboard of the present invention has a protective film which can be produced by dipping, brushing or spraying a transparent waterproof paint. The transparent waterproof paint can transmit light without affecting the normal function of the PCB so that the protective film can achieve anti-insulation, anti-static, waterproof and dustproof functions for the PCB.

Wherein, 1—PCB, 2—LED emitter, 3—light receiver, 4—housing, 5—handle, 6—first light guiding body, 7—second light guiding body, 8—transmitting portion, 9—first light reflecting portion, 10—second light reflecting portion, 11—backlight path, 12—light transmission path, 13—second light blocking component, 14—elastic component, 15—hand-feeling elastic piece, 16—slider, 17—light blocking plate, 18—fixing plate, 19—sealing ring.

DETAILED DESCRIPTION OF THE EMBODIMENTS

The present invention will be further described in detail below with reference to the embodiments and drawings, but the embodiments of the present invention are not limited thereto.

Embodiment 1

Figure 1:
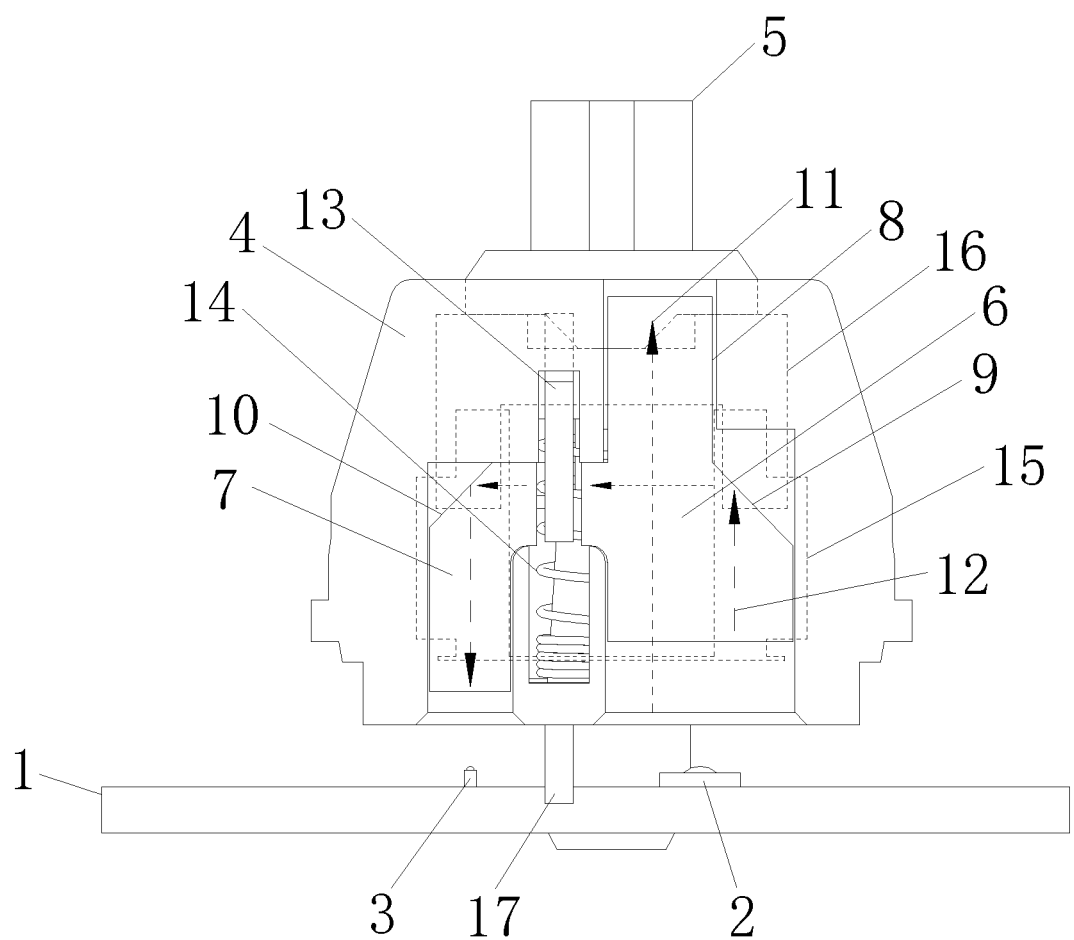
FIG. 1 shows the schematic structure of a split type dual optical path key switch according to embodiment 1 of the present invention.
Figure 2:
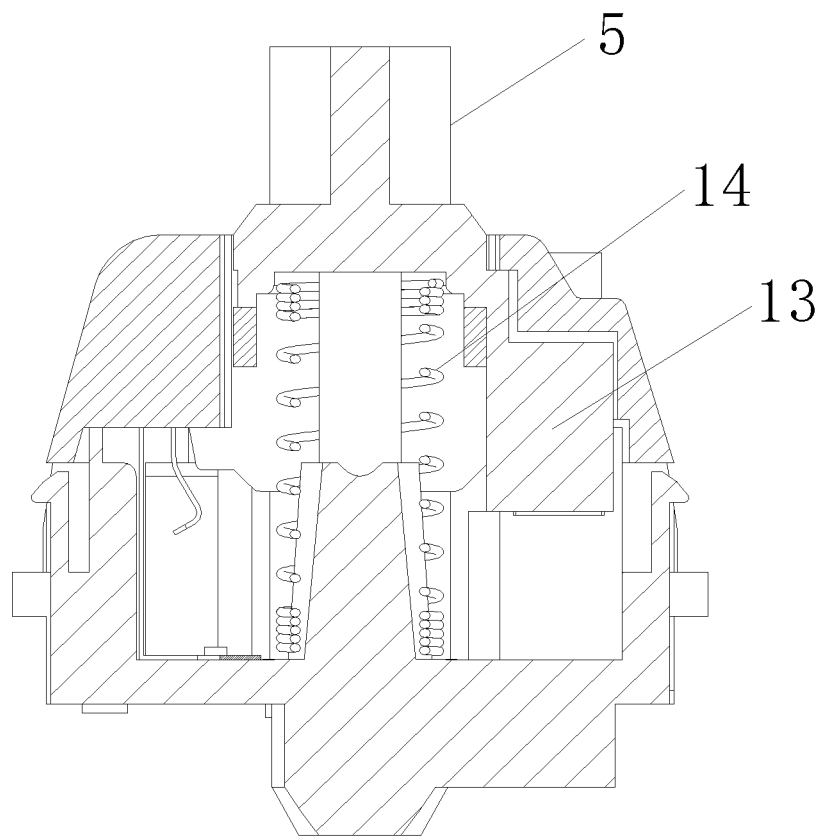
FIG. 2 shows the lateral cross-sectional structure of the housing in a split type dual optical path key switch according to embodiment 1 of the present invention.
Figure 3:
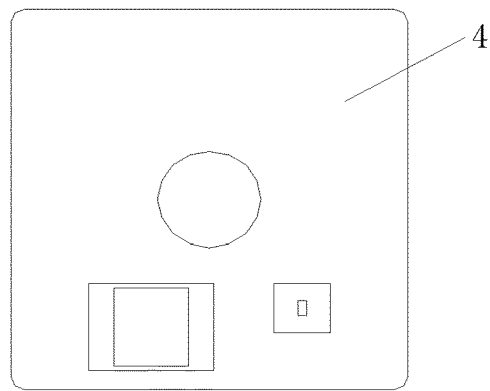
FIG. 3 is a schematic diagram showing the reason why a split type double optical path button switch according to embodiment 1 of the present invention can produce a sense of stepwise pressing and a sound.
Figure 3:
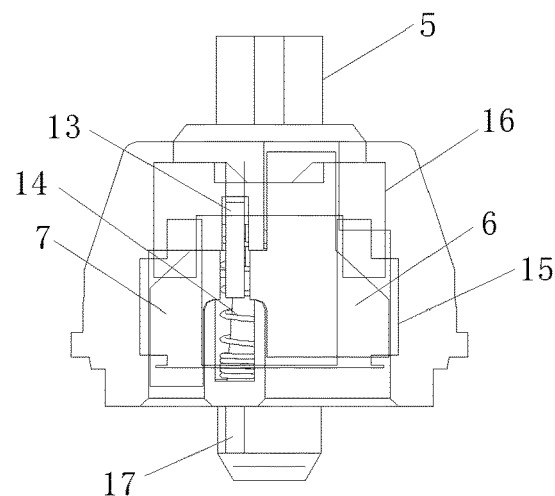
Figure 3:
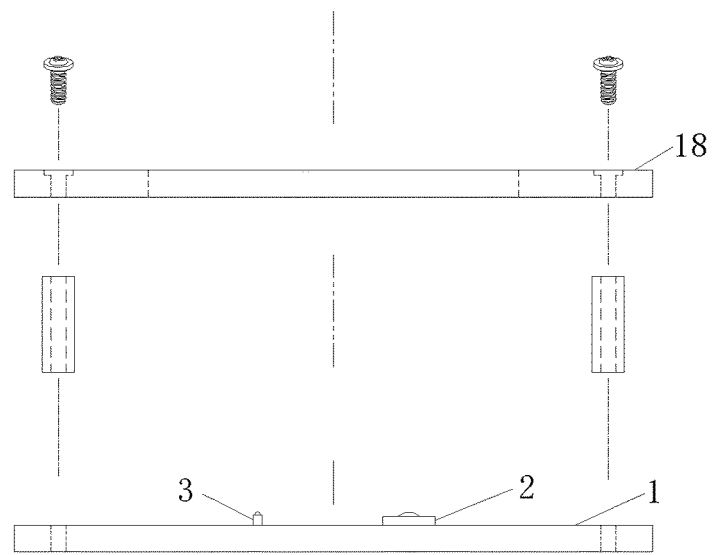

As shown in FIG. 1 to FIG. 3, the split type dual optical path key switch of the embodiment comprises a key switch body, an LED emitter 2 and a light receiver 3 disposed on the PCB 1. The key switch body comprises a housing 4 and a handle 5 disposed on the housing 4. The LED emitter 2 and the light receiver 3 are separated by a first light blocking component; the LED emitter 2 may be a monochromatic (red, green, blue, white, yellow, etc.) LED light, dichromatic LED light or RGB trichromatic LED light.

A first light guiding body 6 is disposed above the LED emitter 2, and a second light guiding body 7 is disposed above the light receiver 3, wherein the first light guiding body 6 and the second light guiding body 7 are both made of materials with good light guiding properties, such as light guiding fiber and light guiding plastic; the first light guiding body 6 is provided with a light transmitting portion 8 and a first light reflecting portion 9, and a second light reflecting portion 10 is disposed on the second light guiding body 7; the light transmitting portion 8 is for transmitting the light emitted by the LED emitter 2, that is, the LED emitter 2 can be used as an indicator light to realize the function of backlight, and the backlight path is as shown by 11 of FIG. 1. Therefore, the first light reflecting portion 9 is disposed obliquely to the left side, the second reflecting part 10 is disposed obliquely to the right side, wherein the slope is generally 30 to 60 degrees. The light emitted by the LED emitter 2 is reflected by the first light reflecting portion 9 to the second light reflecting portion 10, and is further reflected by the second light reflecting portion 10 and returned to the light receiver 3, the optical transmission path of which is as shown by 12 in FIG. 1. With the assist of the first light reflecting portion 9 and the second light reflecting portion 10, the stability of light transmission can be further improved; the handle 5 is provided with a second light blocking component 13, which is used to block the light transmitted from the first light guiding body 6 to the second light guiding body 7.

In this embodiment, the key switch is in a closed form normally, and when the handle 5 is not pressed, the second light blocking component 13 blocks the light transmission path from the first light guiding body 6 to the second light guiding body 7; when the handle 5 is pressed, the second light blocking component 13 is driven to move downward, the first light reflecting portion 9 reflects the light emitted by the LED emitter 2 to the second light reflecting component 10 so that the light transmission path from the first light guiding body 6 to the second light guiding body 7 is clear; when the handle 5 is continuously pressed and released, the optical transmission path 12 can be blocked and connect.

Figure 4:
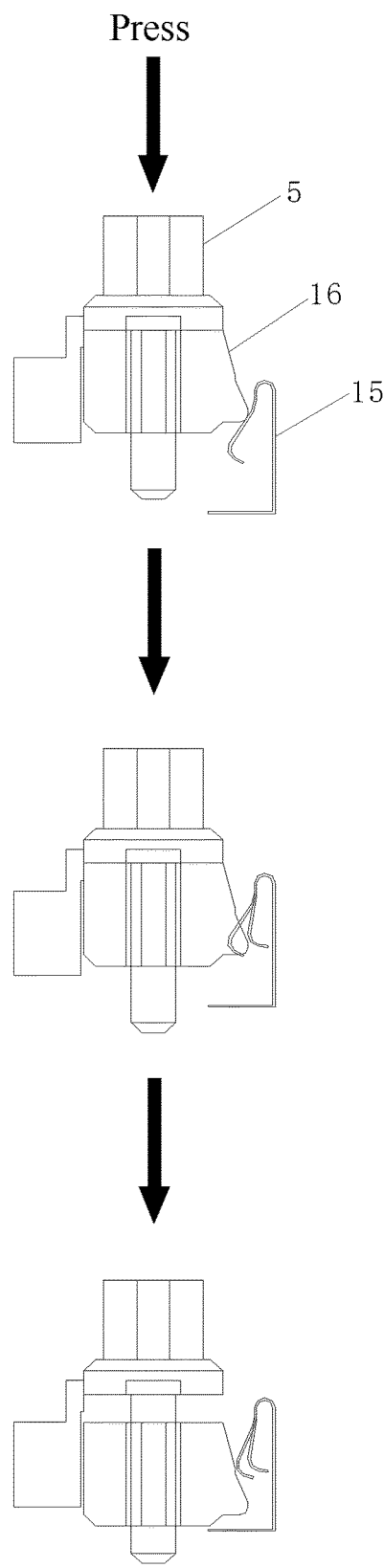
FIG. 4 is an explosion diagram of a split type dual optical path key switch according to embodiment 1 of the present invention.

Since the LED emitter 2 realizes the function of backlight, it is not necessary to separately provide a LED for backlight and a light guiding plate available for transmitting the LED backlight, so that the housing 4 can reserve a large space for other components; the housing 4 comprises an upper housing and an lower housing, the upper housing has a hole (not shown in the figure) where the handle 5 is disposed. The lower housing is provided with an elastic component 14 and a hand-feeling elastic piece 15, wherein the elastic component 14 may be a pressure spring. The handle 5 is disposed above the elastic component 14 and further provided with a slider 16, the left and right front side of which is partially convex to contact with the hand-feeling elastic piece 15; when the handle 5 is pressed as shown in FIG. 4, the slider 16 is driven to move downward (to 1.8 mm), and the shape of the hand-feeling elastic piece 15 is changed by the pressure to provide a sense of stepwise pressing; when the handle 5 moves upward from the bottom (at 2.1 mm), since the handle 5 is separated from the slider 16, they hit with each other and make a sound.

The first light guiding body 6 and the second light guiding body 7 may be in a separated form and assembled in the housing 4; or the first light guiding body 6, the second light guiding body 7 and the housing 4 can be produced by two-color injection molding, by which the components are formed in one piece so that the assembly cost is greatly reduced and the performance is improved.

The first light blocking component is a light blocking plate 17, which is disposed at the bottom of the key switch body. The PCB 1 is provided with a slot corresponding to the light blocking plate (not shown in the figure). The light blocking plate 17 is disposed in the slot, which separates the LED emitter 2 and the light receiver 3, blocks the light and prevents the light of the LED emitter 3 and the external light from entering the light receiver 3.

The LED emitter 2 and the light receiver 3 are fixed on the PCB 1 by means of straight insertion or patching, and the key switch body covers the LED emitter 2 and the light receiver 3. This operation mode separates the mechanical part and the electronic part, which can greatly improve production efficiency and save cost.

Figure 5:
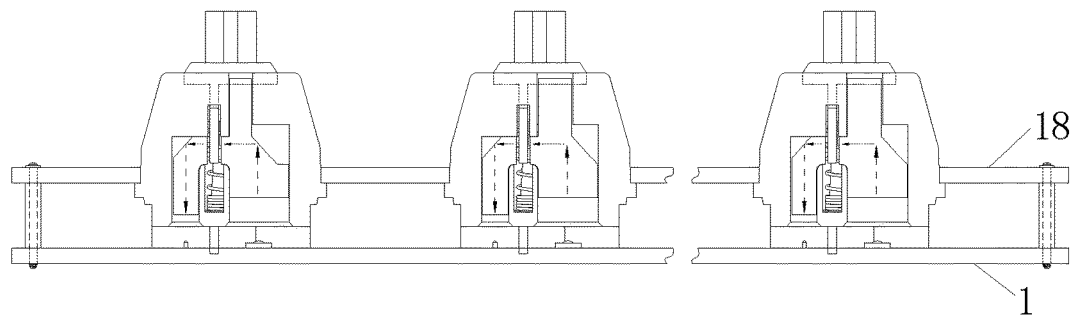
FIG. 5 is a schematic structural diagram of a split type dual optical path mechanical keyboard according to embodiment 1 of the present invention.

As shown in FIG. 5, the present embodiment can produce a split type dual optical path mechanical keyboard by using the above-mentioned normally closed type key switch, wherein the mechanical keyboard comprises a PCB 1 and a normally closed key switch. A fixing plate 18 is disposed between the normally closed key switch and the PCB 1, so that the normally closed key switch is mounted on the PCB 1 through the fixing plate 18; the PCB 1 and the fixing plate 18 can be fixed by screws or clamping, and specifically in this embodiment, it is fixed by screws.

After installing all the components and finishing functional tests, the PCB 1 can be immersed, brushed or sprayed with a transparent waterproof paint, so that the outer surface of the PCB 1 has a protective film. The transparent waterproof paint can transmit light without affecting normal functions of the PCB 1, and the protective film can achieve anti-insulation, anti-static, waterproof, and dust-proof functions on the PCB 1.

Embodiment 2

Figure 6:
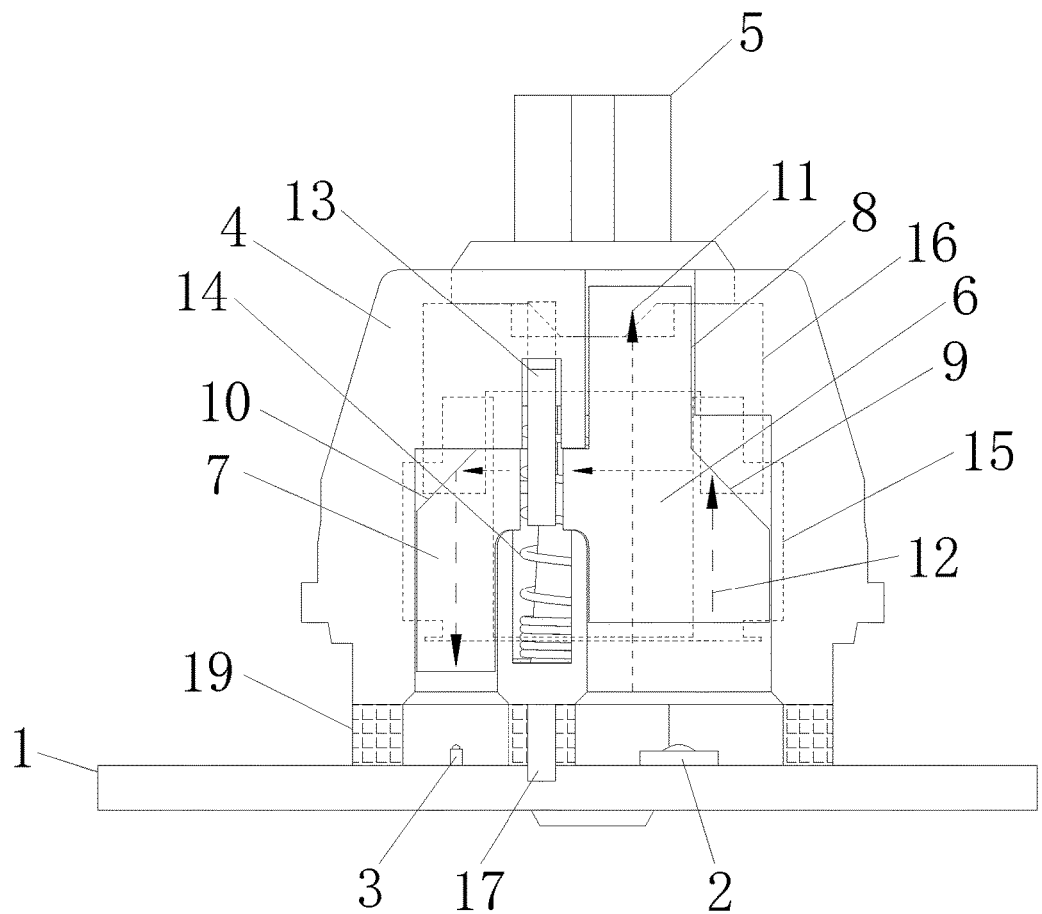
FIG. 6 is a structural diagram of a split type dual optical path key switch according to embodiment 2 of the present invention.

As shown in FIG. 6, the main feature of the embodiment is that the first light blocking component is a combination of a light blocking plate 17 and a sealing ring 19, wherein the light blocking plate 17 is disposed at the bottom of the key switch body. A slot corresponding to the light blocking plate 17 is disposed on the PCB 1, and the light blocking plate 17 is disposed in the slot. The light blocking plate 17 separates the LED emitter 2 and the light receiver 3, thereby achieving a light blocking function to block the light of the LED emitter 2 and the external light from entering the light receiver 3; the sealing ring 19 can be made of a sponge rubber or the like, which can prevent the LED emitter 2 and the light receiver 3 from contacting with outside so as to achieve a dust-proof function. The remaining structures are the same as in embodiment 1.

Embodiment 3

Figure 7:
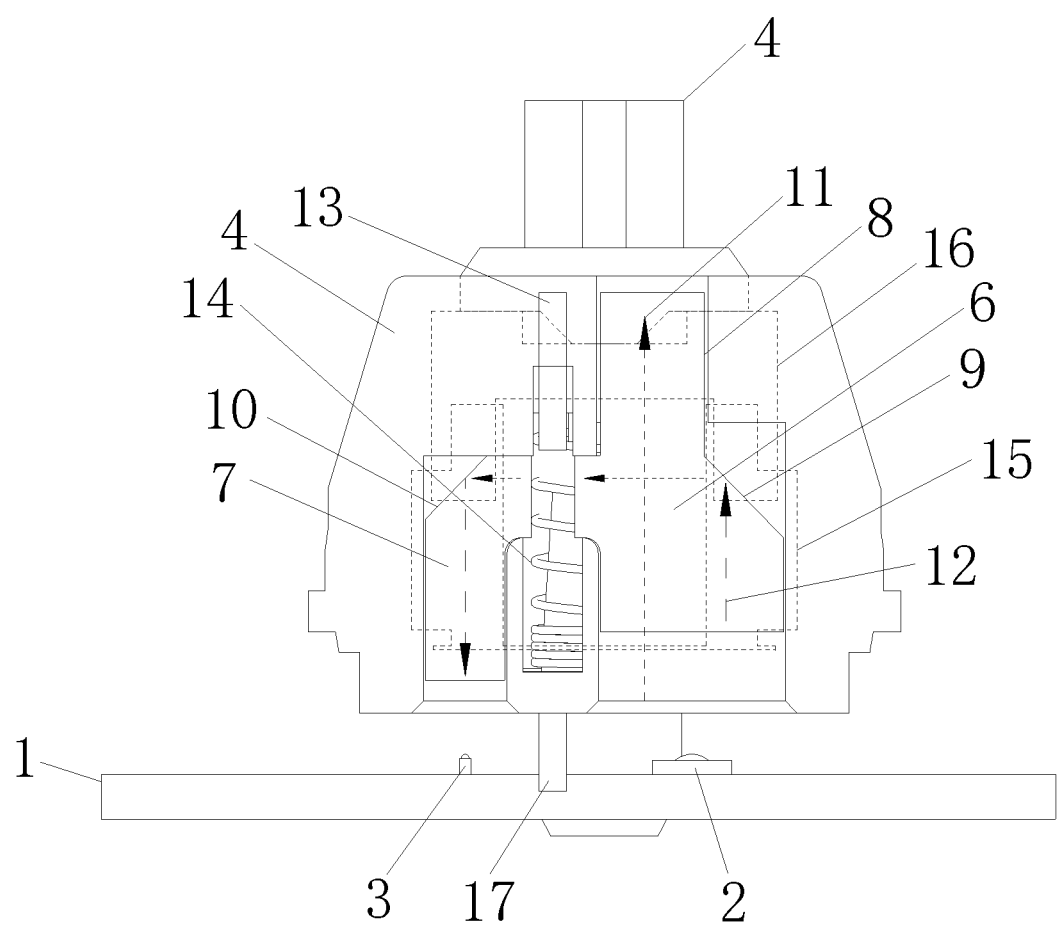
FIG. 7 is a structural diagram of a split type dual optical path key switch according to embodiment 3 of the present invention.

As shown in FIG. 7, the key switch is in an open form normally. When the handle 5 is not pressed, the second light blocking component 13 is located above the gap between the first light guiding body 6 and the second light guiding body 7, so that the light transmission path 12 from the first light guiding body 6 to the second light guiding body 7 is clear; when the handle 5 is pressed, the second light blocking component 13 is driven to move downward to locate in the gap between the first light guiding body 6 and the second light guiding body 7 so that the light transmission path 12 from the first light guiding body 6 to the second light guiding body 7 is blocked; when the handle 5 is pressed and released continuously, the optical transmission path 12 can be blocked and connected. The remaining structures are the same as in embodiment 1.

In summary, the key switch and the mechanical keyboard of the present invention are provided with an LED emitter and a light receiver on the PCB, wherein a first light guiding body is disposed above the LED emitter, and a second light guiding body is disposed above the light receiver. The two light guiding bodies are made of materials with good light guiding properties such as light guiding fibers and light guiding plastics, and the first light guiding body is provided with a light transmitting portion and a first light reflecting portion, while the second light guiding body is provided with a second light reflecting portion. The light emitted by the LED emitter can be transmitted through the light transmitting portion, that is, the LED emitter can function as an indicator light to provide illumination and backlight for the light-transmitting keycap. In addition, by the first light reflecting portion and the second light reflecting portion can reflect the light emitted by the LED emitter to the light receiver. Since the LED emitter realizes the function of backlight, it is not necessary to separately provide an LED for backlight and a light guiding plate for transmitting the LED backlight, so that the housing can reserve a large space for other components. Meantime, transmitting light through the first light guiding body and the second light guiding body improves the stability of light transmission, reduces the cost and process requirements of the key switch, and greatly improves the precision and service life of the mechanical keyboard.

The above are only preferred embodiments of the present invention, but the scope of protection of the present invention is not limited thereto. Within the scope disclosed by the present patent, the technical solutions and their inventive concepts can be equivalently replaced or changed by any person skilled in the art, which are all within the scope of protection of the present invention.

What is claimed is:

1. A split type dual optical path key switch, comprising a key switch body that comprises a housing and a handle disposed on the housing, characterized in that: the split type dual optical path key switch further comprises an LED emitter and a light receiver disposed on a PCB, wherein the LED emitter and the light receiver are separated by a first light blocking component; a first light guiding body is disposed above the LED emitter, and a second light guiding body is disposed above the light receiver; the first light guiding body is provided with a light transmitting portion and a first light reflecting portion, and the second light guiding body is provided with a second light reflecting portion; the light transmitting portion is used for transmitting the light emitted by the LED emitter; the light emitted by the LED emitter is reflected by the first light reflecting portion to the second light reflecting portion, and then reflected by the second light reflecting portion to the light receiver; the handle is provided with a second light blocking component; the second light blocking component is used for blocking the light transmitted from the first light guiding body to the second light guiding body.

2. The split type dual optical path key switch as claimed in claim 1, characterized in that the first light guiding body and the second light guiding body are all in a separated form and are assembled in the housing, or the first light guiding body, the second light guiding body and the housing are prepared by two-color injection molding.

3. The split type dual optical path key switch as claimed in claim 1, characterized in that the key switch is in a closed form normally, and when the handle is not pressed, the second light blocking component blocks the light transmission path from the first light guiding body to the second light guiding body; when the handle is pressed, the second light blocking component is driven to move downward, so that the light transmission path from the first light guiding body to the second light guiding body is clear.

4. The split type dual optical path key switch as claimed in claim 1, characterized in that the key switch is in an open form normally, and when the handle is not pressed, the second light blocking component makes the light transmission path from the first light guiding body to the second light guiding body clear; when the handle is pressed, the second light blocking component is driven to move downward to block the light transmission path from the first light guiding body to the second light guiding body.

5. The split type dual optical path key switch as claimed in claim 1, characterized in that the housing comprises an upper housing and a lower housing, and the upper housing has a hole where the handle is disposed; a hand-feeling elastic piece is disposed in the lower housing, wherein the lower housing is further provided with an elastic component, and the handle is disposed above the elastic component.

6. The split type dual optical path key switch as claimed in claim 1, characterized in that the first light blocking component is a light blocking plate or a combination of a light blocking plate and a sealing ring; the light blocking plate is disposed at the bottom of the key switch body, the PCB board is provided with a slot corresponding to the light blocking plate, which is disposed in the slot.

7. The split type dual optical path key switch as claimed in claim 1, characterized in that the housing is provided with a hand-feeling elastic piece, and the handle is further provided with a slider, the left and right front side of which is partially convex to contact with the hand-feeling elastic piece; when the handle is pressed, the slider is driven to move downward, and the shape of the hand-feeling elastic piece is changed by the pressure to provide a sense of stepwise pressing; when the handle moves upward from the bottom, since the handle is separated from the slider, they hit with each other and make a sound.

8. The split type dual optical path key switch as claimed in claim 1, characterized in that the LED emitter is a monochromatic LED light, a dichromatic LED light or an RGB trichromatic LED light.

9. The split type dual optical path key switch as claimed in claim 1, characterized in that the first light reflecting portion is disposed obliquely to the left side, and the second light reflecting portion is disposed obliquely to the right side.

10. A split type dual optical path mechanical keyboard, comprising a PCB, characterized in that it further comprises a plurality of the key switches as claimed in any one of claims 1-9, wherein a fixing plate is disposed between the PCB and the key switch, and the key switch is mounted on the PCB by the fixing plate; the PCB and the fixing plate are fixed by screws or clamping.

* * * * *